(12) United States Patent
Song et al.

(10) Patent No.: US 10,186,626 B2
(45) Date of Patent: Jan. 22, 2019

(54) PHOTON-EFFECT TRANSISTOR

(71) Applicant: Forwarding Technology LTD, Road Town (GB)

(72) Inventors: Jinhui Song, Northport, AL (US); Chengming Jiang, Tuscaloosa, AL (US)

(73) Assignee: Forwarding Technology LTD, Road Town (GB)

( * ) Notice: Subject to any disclaimer, the term of this patent is extended or adjusted under 35 U.S.C. 154(b) by 0 days.

(21) Appl. No.: 14/821,407

(22) Filed: Aug. 7, 2015

(65) Prior Publication Data

US 2016/0043264 A1    Feb. 11, 2016

Related U.S. Application Data

(60) Provisional application No. 62/034,955, filed on Aug. 8, 2014.

(51) Int. Cl.
*H01L 31/101*    (2006.01)
*H01L 31/112*    (2006.01)
(Continued)

(52) U.S. Cl.
CPC ...... *H01L 31/101* (2013.01); *H01L 27/14601* (2013.01); *H01L 27/14612* (2013.01);
(Continued)

(58) Field of Classification Search
CPC . H01L 31/00; H01L 31/0248; H01L 31/0264; H01L 31/062; H01L 31/10;
(Continued)

(56) References Cited

U.S. PATENT DOCUMENTS 4,740,823 A * 4/1988 Thompson ............ H01L 31/09 257/184
5,567,973 A * 10/1996 Paolella ............ H01L 31/1123 257/257
(Continued)

FOREIGN PATENT DOCUMENTS

EP          178148   *   4/1986 ............ H01L 31/10

OTHER PUBLICATIONS

Kwok K. Ng, Complete Guide to Semiconductor Devices, 2002, IEEE Press / Wiley-Interscience, Second Edition, 423-427 and 660-662.*
(Continued)

*Primary Examiner* — Eduardo A Rodela
(74) *Attorney, Agent, or Firm* — Meunier Carlin & Curfman LLC

(57) ABSTRACT

A two-terminal photon-effect transistor (PET) is described that simplifies the photo sensing pixel by combing photodiode and field effect transistor dual functions into one simple but effective unit. Photons excite electrons from the valance band of semiconducting material as the electrode-free gate to modulate resistivity between source and drain, which directly results in current amplification of photo signal without traditional photo-electrical conversion and electrical amplification dual processes. PET possesses significance in both structural simplification and functional enhancement. As an implementing example of PET, a nanowire camera (NC) with large sensing area and extremely high resolution is fabricated by integrating millions of vertically aligned nanowire arrays in-between of orthogonal top and bottom nano-stripe electrodes. Each nanowire works as independent three-dimensional (3D) PET pixel, enabling the NC an ultra-high resolution and much simplified architecture. NC has pixel size of 50 nm which is
(Continued)

two orders higher than existing CCD and CMOS image sensors.

20 Claims, 20 Drawing Sheets

(51) Int. Cl.
      *H01L 31/18*     (2006.01)
      *H01L 27/146*    (2006.01)
      *H01L 31/0248*   (2006.01)
      *H01L 31/00*     (2006.01)
      *H01L 31/10*     (2006.01)

(52) U.S. Cl.
    CPC ........ *H01L 27/14692* (2013.01); *H01L 31/00* (2013.01); *H01L 31/0248* (2013.01); *H01L 31/10* (2013.01); *H01L 31/1126* (2013.01); *H01L 31/1129* (2013.01); *H01L 31/18* (2013.01)

(58) Field of Classification Search
    CPC ............... H01L 31/101; H01L 31/1016; H01L 31/1121; H01L 31/1123; H01L 31/1124; H01L 31/1126; H01L 31/1128; H01L 31/1129; H01L 31/113; H01L 31/1136
    See application file for complete search history.

(56) References Cited

U.S. PATENT DOCUMENTS

| | | | |
|---|---|---|---|
| 7,279,730 B2* | 10/2007 | Pak | H01L 27/14603 257/290 |
| 2008/0206923 A1* | 8/2008 | Kim | C23C 14/0036 438/104 |
| 2008/0258141 A1* | 10/2008 | Park | H01L 29/78618 257/43 |
| 2014/0263945 A1* | 9/2014 | Huang | H01L 51/428 250/200 |
| 2015/0200282 A1* | 7/2015 | Hirohata | H01L 29/66984 257/194 |

OTHER PUBLICATIONS

Boyle, et al., "Charge coupled semiconductor devices", Bell Sys. Tech. J. 49, 1970, 587-593.

Cui, et al., "High Performance Silicon Nanowire Field Effect Transistors", Nano Letters, 3, 2003, 149-152.

Fan, et al., "Zinc oxide nanostructures: Synthesis and properties", J Nanosci Nanotechno 5, 1-13.

Furuta, et al., "A High-Speed, High-Sensitivity Digital CMOS Image Sensor With a Global Shutter and 12-bit Column-Parallel Cyclic A/D Converters", IEEE J. Solid-State Circ. 42, 2007, 766-774.

Galup-Montoro, M. C. Schneider, London Singapore: World Scientific. pp. 83. 2007. ISBN 9812568107.

Gedamu, et al., "Rapid Fabrication Technique for Interpenetrated ZnO Nanotetrapod Networks for Fast UV Sensors", Adv. Mater. 26, 2013, 1541-1550.

Goldberger, et al., "ZnO Nanowire Transistors", J. Phys. Chem. B, 109, 2005, 9-14.

Huang, et al., "Whole-cell 3D STORM reveals interactions between cellular structures with nanometer-scale resolution", Nature Methods 5, 2008, 1047-1052.

Kind, et al., "Nanowire ultraviolet photodetectors and optical switches", Adv. Mater. 14, 2002, 158-160.

Ko, et al., "A hemispherical electronic eye camera based on compressible silicon optoelectronics", Nature 454, 2008, 748-753.

Law, et al., "Simple fabrication of a ZnO nanowire photodetector with a fast photoresponse time", Appl. Phys. Lett. 88, 2006, 133114.

Lumb, et al., "Energy and time response of CCD X-ray detectors", IEEE T Nucl Sci 39, 1992, 4 pages.

"PCO Computer Optics. Pixel size & sensitivity." 7 pages http://www.pco.de/fileadmin/user_upload/db/download/kb_pixel_size_sensitivity_20100721.pdf.

Tian, et al., "Three-dimensional, Flexible Nanoscale Field Effect Transistors as Localized Bioprobes", Science 329, 2010, 830-834.

Tucker, et al., "The role of optics in computing", Nature Photonics 4, 2010, pp. 405.

Volz, et al., "Triggering an Optical Transistor with One Photon", Science 341, 2013, 725-726.

Woods, et al., "Optical computing: Photonic neural networks", Nature Physics 8, 2012, 257-259.

Wu, et al., "Taxel-Addressable Matrix of Vertical-Nanowire Piezotronic Transistors for Active and Adaptive Tactile Imaging", Science 340, 2013, 952-957.

Xia, et al., "Response Time of Silicon Photodiodes for DUV/EUV Radiation", Instrumentation and Measurement Technology Conference Proceedings, 2008. IMTC 2008. IEEE, May 12-15, 2008, 4 pages.

* cited by examiner

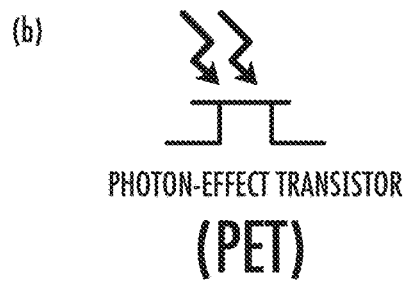
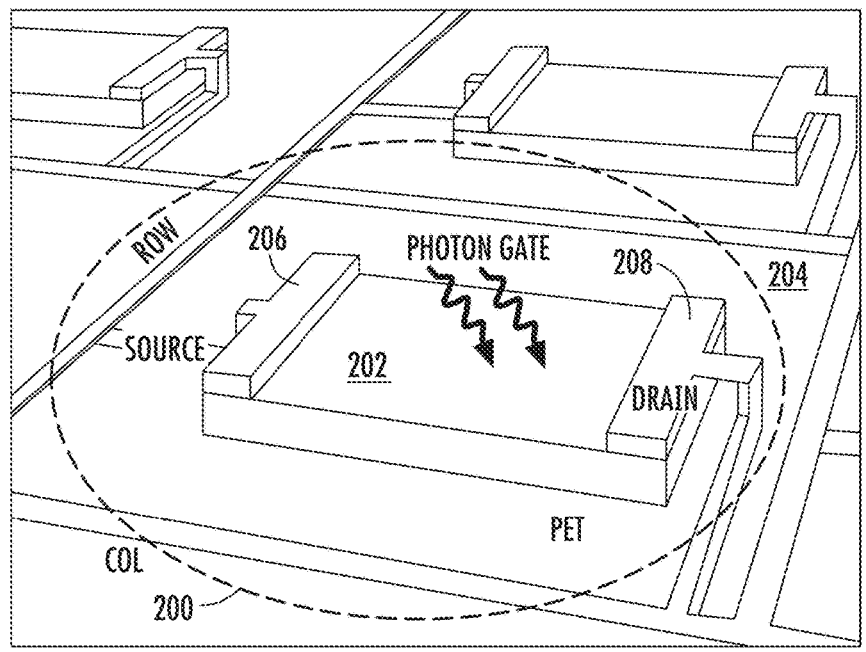
FIG. 2

MOVING "H"

PHOTON-EFFECT TRANSISTOR

CROSS-REFERENCE TO RELATED APPLICATION

This application claims benefit of and priority to U.S. Provisional Patent Application Ser. No. 62/034,955, which was filed on Aug. 8, 2014 and is fully incorporated by reference herein and made a part hereof.

BACKGROUND

A field-effect transistor (FET), which is a fundamental element of digital integrated-circuits, is comprised of three-terminal architecture and functions as a small amplifier to amplify gate signal by modulating the resistance between source and drain. Substantial efforts have been put on minimization of FET in order to integrate more units to increase chip performance and lower power consumption. All the improvements thus far have been restricted to optimization by using alternative materials, shape design, etc., which progresses slowly toward the unit size limitation. To eventually overcome this limitation, architecture level redefinition to substantially reduce FET size is highly desired.

Besides applications in logic circuits, FETs are widely used in sensors, acting as readout electronic component of sensor pixel to amplify sensed electrical signals. Referring now to FIG. 1, the pixel of an image sensor, the digitalizing electronics of vision information that dominates human's recognition of the world, is typically composed of a plurality of discrete components including a photo-detector diode (PD) that converts optical information into an electrical signal and one or more FETs to further amplify the electrical signal. FIG. 1 illustrates an exemplary structure of a CMOS pixel, comprised of a photodiode (PD) to convert a photo signal into an electrical signal, a field-effect transistor (FET) to further amplify the converted electrical signal, and corresponding multi-interconnection layout. Such sensor architecture has seen very little change since its inception, and has generally been kept intact even for the pixel miniaturization process. This traditional sensing scheme not only requires complicated integration of multi-functional components in one pixel, but also inherently induces noise during the signal converting and electrical amplifying dual processes, which directly results in low resolution and weak sensitivity.

Therefore, what are needed are devices, systems and methods that overcome challenges in the present art.

SUMMARY

An image sensor pixel may not require complicated multi-component architecture as is now used. Described herein are embodiments of a photon-effect transistor (PET) that can effectively implement light signal sensing and electrical signal amplifying dual functions into one simple unit. Owning a two-terminal structure and functioning as an overall pixel, embodiments of the PET described herein possess structural simplification even compared with FET.

In one aspect, a photon-effect transistor (PET) is described. One embodiment of the PET comprises a source; a photon-gate; and a drain. The components that comprise the PET can be integrated onto a single chip. The PET can be at least partially fabricated using thin-film fabrication techniques including thin-film deposition. In one aspect, current flow between the source and the drain can be controlled by a light signal received by the photon-gate. In one aspect, the photon-gate is at least partially comprised of photonic material. One or more of the source, drain and photon-gate can be formed by a top down lithography process on a semiconducting thin film. The photonic material can be, for example, zinc oxide (ZnO), silicon (Si), or any other semiconducting materials that exhibit the photo effect. In one aspect, one or both of the source and the drain are at least partially comprised of material that allow light to pass through them such as translucent materials or transparent materials. In one exemplary application of embodiments of a PET, the photon-effect transistor is used to at least partially form a nanowire camera.

In one aspect, a photon-effect transistor (PET) is described. One embodiment of the PET comprises a source; a photon-gate; and a drain. The components that comprise the PET can be integrated onto a single chip. The PET can be fabricated using thin-film fabrication techniques including thin-film deposition. In one aspect, current flow between the source and the drain can be controlled by a light signal received by the photon-gate. In one aspect, the photon-gate is at least partially comprised of one or more vertically-aligned nanowires. The nanowires are comprised of photonic material such as zinc oxide (ZnO), silicon (Si), or any other semiconducting materials that exhibit the photo effect. In one aspect, one or both of the source and the drain are at least partially comprised of material that allow light to pass through them such as translucent materials or transparent materials. In one exemplary application of embodiments of a PET, the photon-effect transistor is used to at least partially form a nanowire camera.

In another aspect, a three-dimensional (3D) photon-effect transistor (PET) is described. One embodiment of the 3D PET is comprised of a source; a photon-gate, wherein the photon gate is at least partially comprised of one or more vertically-aligned semiconductors; and a drain. The components that comprise the 3D PET can be integrated onto a single chip. The 3D PET can be at least partially fabricated using thin-film fabrication techniques including thin-film deposition. In one aspect, current flow between the source and the drain can be controlled by a light signal received by the photon-gate. In one aspect, the photon-gate is at least partially comprised of vertically-aligned photonic material such as zinc oxide (ZnO), silicon (Si), or any other semiconducting materials that exhibit the photo effect. One or more of the source, drain and photon-gate can be formed by a top down lithography process on a semiconducting thin film. In one aspect, one or both of the source and the drain are at least partially comprised of material that allow light to pass through them such as translucent materials or transparent materials. In one exemplary application of embodiments of a 3D PET, the photon-effect transistor is used to at least partially form a nanowire camera.

In another aspect, a three-dimensional (3D) photon-effect transistor (PET) is described. One embodiment of the 3D PET is comprised of a source; a photon-gate, wherein the photon gate is at least partially comprised of one or more vertically-aligned nanowires; and a drain. The components that comprise the 3D PET can be integrated onto a single chip. The 3D PET can be fabricated using thin-film fabrication techniques including thin-film deposition. In one aspect, current flow between the source and the drain can be controlled by a light signal received by the photon-gate. In one aspect, the photon-gate is at least partially comprised of one or more vertically-aligned nanowires. The nanowires are comprised of photonic material such as zinc oxide (ZnO), silicon (Si), or any other semiconducting materials that exhibit the photo effect. In one aspect, one or both of the source and the drain are at least partially comprised of material that allow light to pass through them such as translucent materials or transparent materials. In one exemplary application of embodiments of a 3D PET, the photon-effect transistor is used to at least partially form a nanowire camera.

In another aspect, a semi-conducting electronic device is described. One embodiment of the semi-conducting electronic device is comprised of a source; a drain; and a semiconducting material at least partially comprised of photonic material that is connected between the source and the drain, wherein current flow between the source and the drain is controlled by a light signal received by the photonic material. In one aspect, the photonic material is vertically aligned, having a first end and a second end, and the source is connected to one end of the vertically aligned photonic material and the drain is connected to the second end of the vertically aligned photonic material. The components that comprise the semi-conducting electronic device can be integrated onto a single chip. The semi-conducting electronic device can be at least partially fabricated using thin-film fabrication techniques including thin-film deposition. One or more of the source, drain and semiconducting material can be at least partially formed by a top down lithography process on a semiconducting thin film. The photonic material can be, for example, zinc oxide (ZnO), silicon (Si), or any other semiconducting materials that exhibit the photo effect. In one aspect, one or both of the source and the drain are at least partially comprised of material that allow light to pass through them such as translucent materials or transparent materials. In one exemplary application of embodiments of a semi-conducting electronic device, the device is used to at least partially form a nanowire camera.

In another aspect, a semi-conducting electronic device is described. One embodiment of the semi-conducting electronic device is comprised of a source; a drain; and a nanowire at least partially comprised of photonic material that is connected between the source and the drain, wherein current flow between the source and the drain is controlled by a light signal received by the nanowire. In one aspect, the nanowire is vertically aligned, having a first end and a second end, and the source is connected to one end of the vertically aligned nanowire and the drain is connected to the second end of the vertically aligned nanowire. The components that comprise the semi-conducting electronic device can be integrated onto a single chip. The semi-conducting electronic device can be fabricated using thin-film fabrication techniques including thin-film deposition. The photonic material that comprises the nanowires can be, for example, zinc oxide (ZnO), silicon (Si), or any other semiconducting materials that exhibit the photo effect. In one aspect, one or both of the source and the drain are at least partially comprised of material that allow light to pass through them such as translucent materials or transparent materials. In one exemplary application of embodiments of a semi-conducting electronic device, the device is used to at least partially form a nanowire camera.

In yet another aspect, a nanowire camera (NC) is described. One embodiment of a NC comprises a plurality of photon-effect transistors, wherein each photo effect transistor is comprised of a source; a photon-gate; and a drain. In one aspect, the photon gate of each photon-effect transistor is comprised of a semiconducting material that is at least partially comprised of photonic material that is connected between the source and the drain. The photonic material can be, for example, zinc oxide (ZnO), silicon (Si), or any other semiconducting materials that exhibit the photo effect. In one aspect, the photonic material is vertically aligned, having a first end and a second end, and the source is connected to one end of the vertically aligned photonic material and the drain is connected to the second end of the vertically aligned photonic material. Current flow between the source and the drain of each photon-effect transistor is controlled by a light signal received by the photonic material. In one aspect, the nanowire camera has a pixel size of 50 nm or less. In another aspect, the nanowire camera has a pixel size of greater than 50 nm. In one aspect, the source, the photon-gate and the drain of the PET that comprise the NC are integrated onto a single chip. In one embodiment, the PET that forms the NC is connected to a processor. In one aspect, each PET that forms the NC forms a single pixel for the NC.

In yet another aspect, a nanowire camera (NC) is described. One embodiment of a NC comprises a plurality of photo-effect transistors, wherein each photo effect transistor is comprised of a source; a photon-gate; and a drain. In one aspect, the photon gate of each photon-effect transistor is comprised of a nanowire that is at least partially comprised of photonic material that is connected between the source and the drain. The photonic material can be, for example, zinc oxide (ZnO), silicon (Si), or any other semiconducting materials that exhibit the photo effect. In one aspect, the nanowire is vertically aligned, having a first end and a second end, and the source is connected to one end of the vertically aligned nanowire and the drain is connected to the second end of the vertically aligned nanowire. Current flow between the source and the drain of each photon-effect transistor is controlled by a light signal received by the nanowire. In one aspect, the nanowire camera has a pixel size of 50 nm or less. In another aspect, the nanowire camera has a pixel size of greater than 50 nm. In one aspect, the source, the photon-gate and the drain of the PET that comprise the NC are integrated onto a single chip. In one embodiment, the PET that forms the NC is connected to a processor. In one aspect, each PET that forms the NC forms a single pixel for the NC.

In another aspect, a method of fabricating a photon-effect transistor is described. One embodiment of the method comprises forming a photon gate at least partially comprised of semiconducting material that exhibits a photon effect; forming two electrodes; and sandwiching the photon gate between the two electrodes. One or more of the two electrodes and the semiconducting material can be at least partially formed by a top down lithography process on a semiconducting thin film. In various aspects, the semiconducting material can be a photonic material comprised of zinc oxide (ZnO), silicon (Si), or any other semiconducting materials that exhibit the photo effect. In one aspect, the photonic material can be formed on a substrate and the substrate can comprise a silicon (Si) substrate. In one aspect, the photon-effect transistor is used to form a nanowire camera.

In another aspect, a method of fabricating an array of photon-effect transistors is described. One embodiment of the method comprises forming a nanowire array; forming two nano-stripe electrodes; and orthogonally sandwiching the nanowire array between the two nanostripe electrodes. In one aspect, forming a nanowire array comprises growing vertically aligned nanowires on a substrate. In various aspects, the nanowire array can be comprised of a plurality of zinc oxide (ZnO) nanowires, a plurality of silicon (Si) nanowires, or any other semiconducting materials that exhibit the photo effect. In one aspect, the substrate can comprise a silicon (Si) substrate. In one aspect, forming a nanowire array comprises growing nanowires by a low-temperature method on a flat silicon (Si) substrate (001) with sputtered ZnO as a seed layer. In one aspect, the nanowire array has a height of approximately 1.5 µm and a radius of approximately 25 nm. In one aspect, forming a nanowire array further comprises spreading and filling a diluted dielectric material into the nanowire array. In one aspect, the diluted electric material comprises polydimethylsiloxane (PDMS). In one aspect, forming a nanowire array further comprises curing and hardening the diluted dielectric material, peeling the hardened diluted dielectric material with embedded nanowires off the substrate, and milling the hardened diluted dielectric material with embedded nanowires to expose both ends of the nanowires. In one aspect, the hardened diluted dielectric material with embedded nanowires is milled with oxygen plasma. In one aspect, forming two nano-stripe electrodes can comprise: preparing a solid wafer with a nano-trench pattern; sputtering a layer of diluted PDMS onto the solid wafer; solidifying the PDMS; peeling the solidified PDMS off of the solid wafer; pressing the solidified PDMS layer onto a flat substrate; filling channels in the solidified PDMS layer with photoresist and prebaking; peeling off the flat substrate to expose the PDMS and photoresist; sputter a thin layer of conductive material onto the PDMS and photoresist; and developing and removing the photoresist. In one aspect, the flat substrate comprises a silicon (Si) flat substrate. In one aspect, the thin layer of conductive material comprises gold. In one aspect, the array of photon-effect transistors is used to form a nanowire camera.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other and like reference numerals designate corresponding parts throughout the several views:

FIG. 2 illustrates overview architecture of a PET according to embodiments of the present invention;

DETAILED DESCRIPTION

Figure 1:
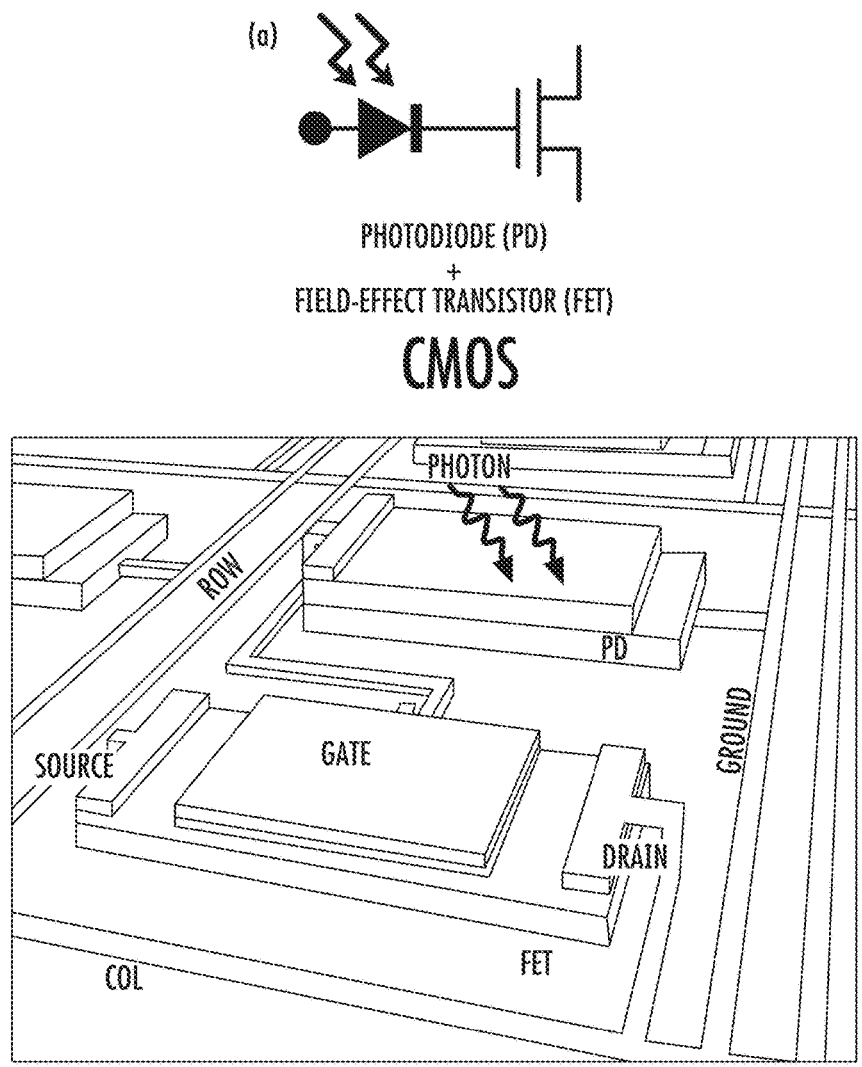
FIG. 1 illustrates an exemplary structure of a CMOS pixel, comprised of a photodiode (PD) to convert a photo signal into an electrical signal, a field-effect transistor (FET) to further amplify the converted electrical signal, and corresponding multi-interconnection layout.

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Photon-Effect Transistor (PET)

FIG. 2 is overview architecture of a PET 200 according to embodiments of the present invention. As shown in FIG. 2, photosensitive semiconducting material 202 works both as photo sensing and electrical signal amplifying parts. Photo signals interact with the semiconducting material 202 to form an electrode-free gate (photon gate 204) so that gate signals can be directly converted as amplified electrical signals through a resistance change between the source 206 and drain 208. The operation of the photon gate 204 relies on the physics of free electrons excited by photons, leading to the conductivity change of the semiconducting material. Without multi-components, as required by FETs and other electronic devices such as charge-coupled devices (CCDs), the photo sensitive "photon gate" occupies most of the pixel area, resulting in much stronger sensitivity and higher efficiency compared with the same size pixel of a CMOS structure. Plus, the two-terminal architecture of embodiments of the PET significantly reduces the complexity and space cost of interconnect layout and the direct electrical amplification of photo signals effectively reduces signal distortion caused by signal-conversion-amplification dual processes. As shown in the embodiment of a PET in FIG. 2, the structure of PET, comprised of one simple two-terminal semiconductor device, can effectively work as one entire image sensor pixel.

Figure 3:
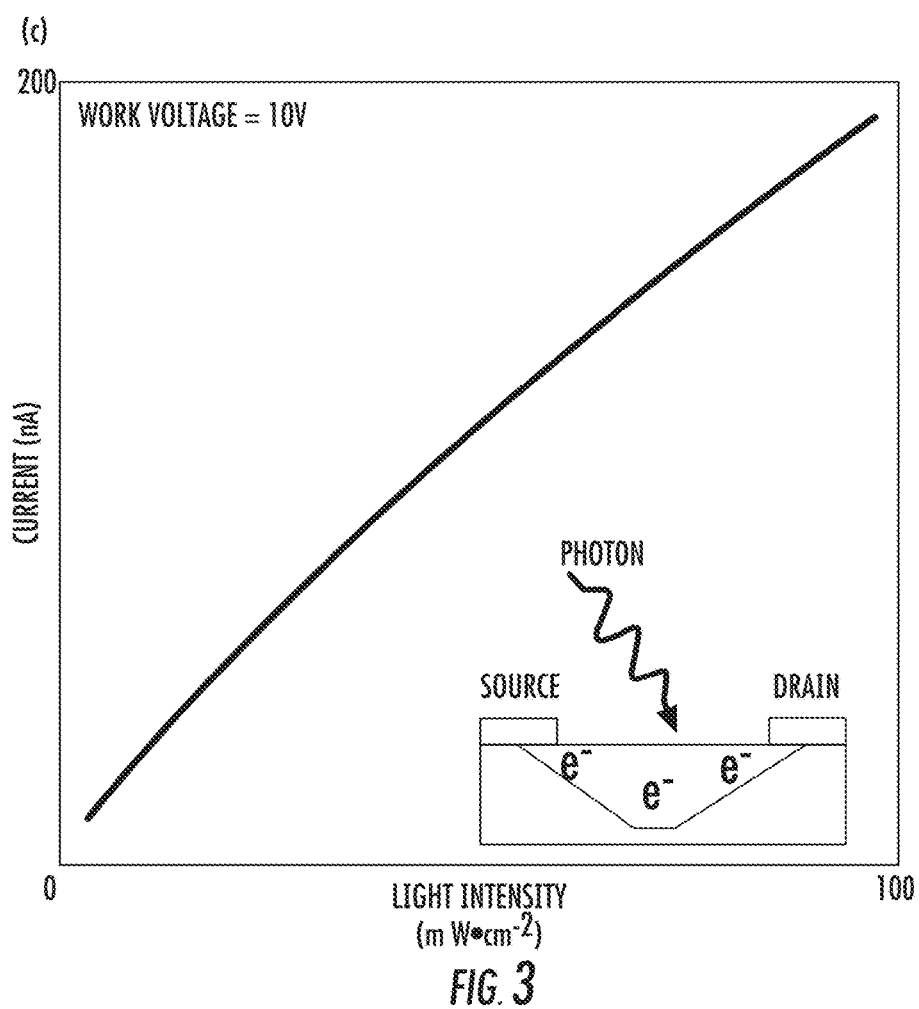
FIG. 3 shows the simulation result on the performance of PET with direct electrical amplification of illuminating light intensity.

FIG. 3 shows the simulation result on the performance of an embodiment of a PET with direct electrical amplification of illuminating light intensity. FIG. 3 illustrates PET current output versus light illumination at a 10V bias. The inset in FIG. 3 is a simple schematic diagram of photon induced electron distribution controlled by the electrode-free photon-gate in an embodiment of a PET.

In the atoms that materials are comprised of, electrons bounded to nuclei are distributed in discrete shells having quantified energy levels. Electrons in atoms and molecules can change energy levels by absorbing photons whose energy must be exactly equal to the energy difference between the two levels. For semiconductors, the electron state can be classified into valance and conduction band. In the valance band, electrons are fixed in the energy cells of the atoms and cannot change orbits, while electrons can move freely in the atomic lattice if they are excited from the valance band into the conduction band. When electrons are excited from the valance band to the conduction band, semiconducting materials display photoconductive properties. From quantum physics, energy and frequency is correlated by Planck's relation (Eq. 1):

$$\varepsilon = h\nu = \frac{hc}{\lambda} = E_2 - E_1 \qquad (1)$$

Where $\varepsilon$ is the excited energy. $\nu$ is the frequency of incident light. c is the speed of light. $\lambda$ is the wavelength of incident light. $E_2$ is the energy for electron in conduction band. $E_1$ is the energy of electron in valance band. h is the Planck constant. A photon-effect transistor (PET) amplifies the intensity of photons that are incident on the semiconducting materials through the photoconductivity change.

Photoconductivity is an optical and electrical phenomenon in which a material becomes more electrically conductive due to the absorption of electromagnetic radiation such as visible light, ultraviolet light, infrared light, or gamma radiation, etc. When light is absorbed by a material, such as a semiconductor, the number of free electrons and electron holes increases and raises material electrical conductivity. Such materials may also be referred to as photonic materials. To cause excitation, the electromagnetic wave that is incident on the semiconductor must have enough energy to raise electrons across the band gap. When the semiconducting material works as a resistor load and a bias voltage is applied, the resistance can be modulated by the intensity of electromagnetic radiation that is incident on the semiconductor as an electrode-free gate. Such a scheme effectively realizes electromagnetic radiation signal amplification by the electrical current through the semiconductor. Electrical conductivity is the reciprocal of electrical resistivity, and it measures a material's ability to conduct an electric current. As for n-type semiconductor, such as zinc oxide (ZnO), the conductivity can be calculated as (Eq. 2):

$$\sigma = n_e \mu_e e + n_h \mu_h e \qquad (2)$$

where $n_e$ is density of electrons. $\mu_e$ is electrical mobility. $n_h$ is density of holes. $\mu_h$ is hole mobility, e is the electron charge.

At room temperature, 300K, for ZnO nanowires, $n_e = n_h$, $u_e = 200 \text{ cm}^2 \text{V}^{-1}\text{s}^{-1}$, $u_h = 5 \text{ cm}^2 \text{V}^{-1}\text{s}^{-1}$. Because $u_e \gg u_h$, second term of equation (2) can be reasonably ignored. Equation (2) can be rewritten as (Eq. 3):

$$\sigma \approx n_e \mu_e e \qquad (3)$$

Taking, for example, a ZnO nanowire with hexagonal cross-section, the resistance could be approximately expressed as:

$$R = \frac{2l}{3\sqrt{3}\, r^2 \sigma}.$$

Exposing the ZnO nanowire under 400 nm wavelength light illumination and under biased voltage of U, the current runs through the ZnO nanowire is (Eq. 4):

$$I = \frac{U}{R} = \frac{3\sqrt{3}\, r^2 \sigma U \mu_e e \left( n_d + \frac{P\lambda}{hc} \right)}{2l} \quad (4)$$

where U is the applied voltage. l is the nanowire length, r is the radius. σ is the conductivity. $n_d$ is the electron density in dark. P is the light power illuminated on ZnO nanowire.

A plot of equation (4) is shown as FIG. 3, which clearly shows the light signal can be amplified through the photon effect by causing a resistance change between source and drain of an exemplary PET.

Three-Dimensional (3D) PET

Figure 4:
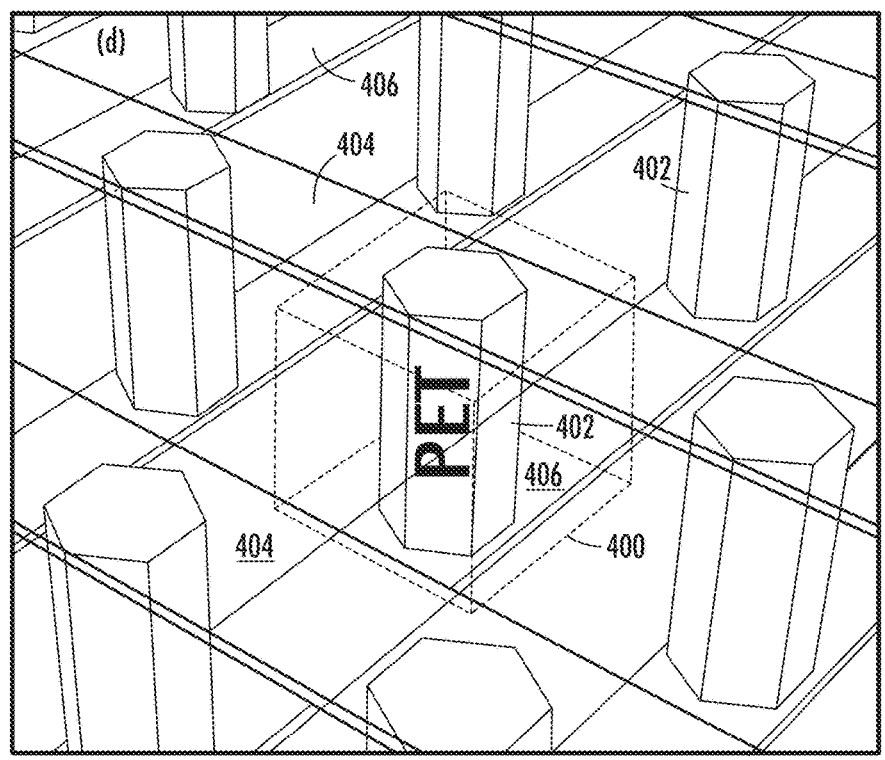
FIG. 4 schematically illustrates a structure of vertically-aligned PETs that can be used in, for example, a nanowire camera (NC)

To further reduce the planar pixel size, one embodiment of a PET comprises a three-dimensional (3D) PET matrix with vertically aligned semiconducting materials, working as functional camera pixels to effectively reduce existing image sensor pixel size from approximately 1.43 µm to approximately 50 nm. For example, the semiconducting materials can be at least partially comprised of photonic materials such as zinc oxide (ZnO), silicon (Si), or any other semiconducting material that exhibits the photo effect. In one embodiment, the vertically aligned semiconducting materials can comprise vertically-aligned nanowire arrays. FIG. 4 schematically illustrates a structure of vertically-aligned PETs that can be used in, for example, a nanowire camera (NC). As shown in FIG. 4, 3D PET pixels 400 can be comprised of vertically aligned nanowires 402 sandwiched in-between top 404 and bottom 406 nano-stripe electrodes that form an orthogonal cross-bar structure. The nanowires 402 can be at least partially comprised of photonic materials. For example, the nanowires 402 can be comprised of ZnO, silicon (Si), or the like. The top 404 and bottom 406 nano-stripe electrodes form the source and drain of the PET 400. Generally, the top 404 and bottom 406 nano-stripe electrodes can be comprised of conductive materials such as, for example, thin gold film, indium-tin-oxide (ITO), platinum and the like, and may be aligned in orthogonal configurations. In various embodiments, one or more of the top 404 and bottom 406 nano-stripe electrodes can be at least partially comprised of materials that allow light to pass through them. For example, the one or more of the top 404 and bottom 406 nano-stripe electrodes can be at least partially comprised of translucent or transparent and conductive materials. In another example, the one or more of the top 404 and bottom 406 nano-stripe electrodes can be at least partially comprised of transparent materials. For example, in one embodiment light can pass through the top electrode 404 and interact with the nanowire 402, which acts as the photon gate.

In other embodiments, vertically-aligned PETs can be comprised of a source, a photon-gate that is at least partially comprised of one or more vertically-aligned semiconductors, and a drain. The source, the photon-gate and the drain can be integrated onto a single chip. In one aspect, any one of the source, the photon-gate and the drain can be at least partially fabricated using thin-film fabrication techniques including thin-film deposition. In other aspects, any one of the source, the photon-gate and the drain can be at least partially fabricated using a top down lithography process on semiconducting thin film. As described herein, current flow between the source and the drain is controlled by a light signal received by the photon-gate, wherein the photon-gate is at least partially comprised of vertically-aligned semiconducting photonic materials such as zinc oxide (ZnO), silicon (Si), or any other semiconducting material that exhibits the photo effect. The electrodes that form the source and drain can be comprised of the materials as described with respect to FIG. 4

Nanowire Camera (NC)

Figure 5:
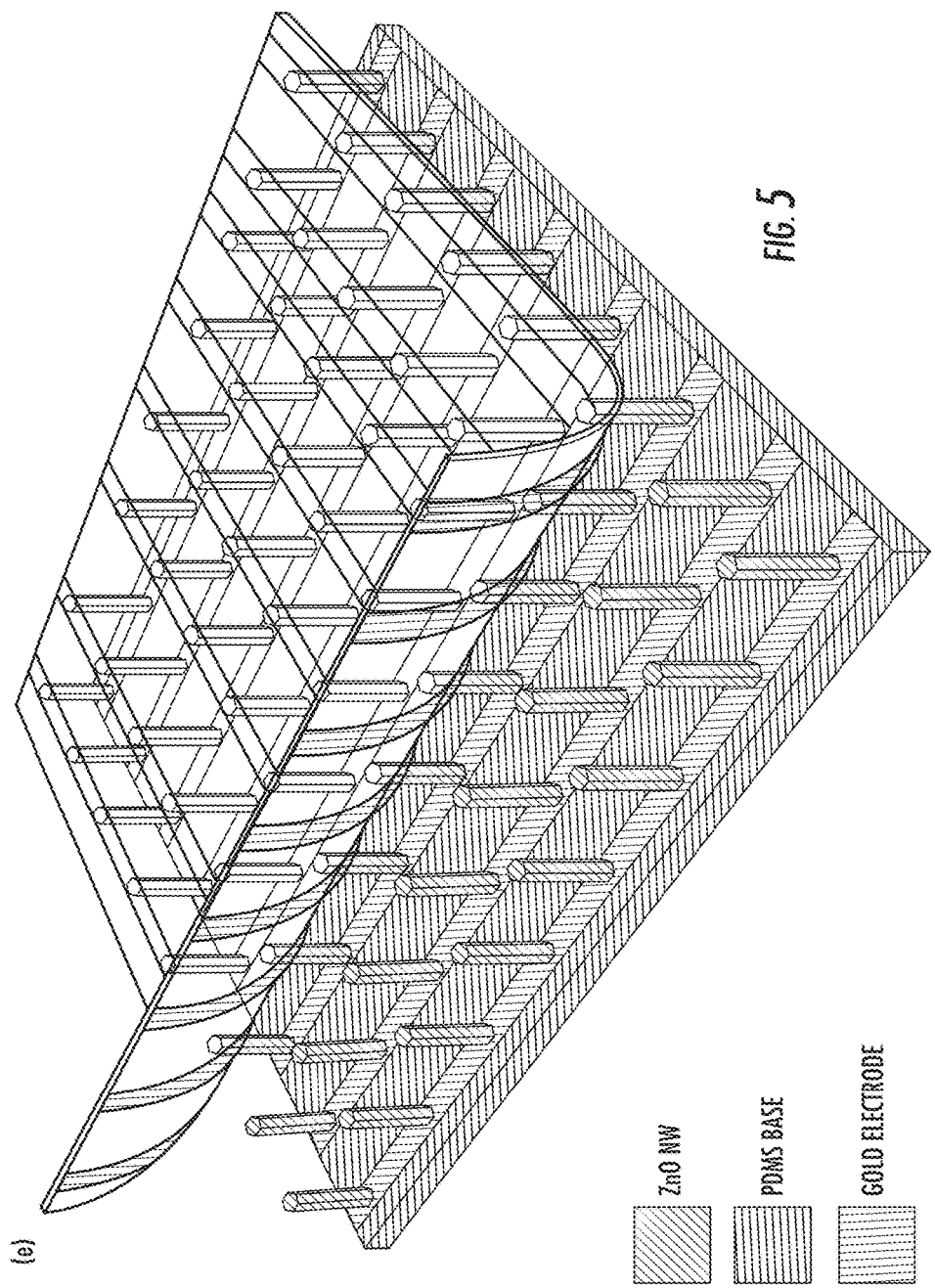
FIG. 5 illustrates the structure and design of an exemplary nanowire camera comprised of arrays of vertically aligned PETs.

FIG. 5 illustrates the structure and design of an exemplary nanowire camera comprised of arrays of vertically aligned PETs. In this exemplary embodiment, vertically aligned nanowire arrays are connected firstly with bottom parallel nano-stripe electrodes then orthogonal stripe electrodes at top. As noted herein, the nanowires can be at least partially comprised of photonic materials such as ZnO, Si, and the like. In one aspect, stripe electrodes can be fabricated on a translucent or transparent flexible polymer by a nano-imprinting process. In one aspect, a transparent flexible polymer can be polydimethylsiloxane (PDMS). Each individual vertically aligned nanowire works as a 3D PET pixel and can be addressed by corresponding top and bottom electrodes that connect it as source and drain.

Figure 6:
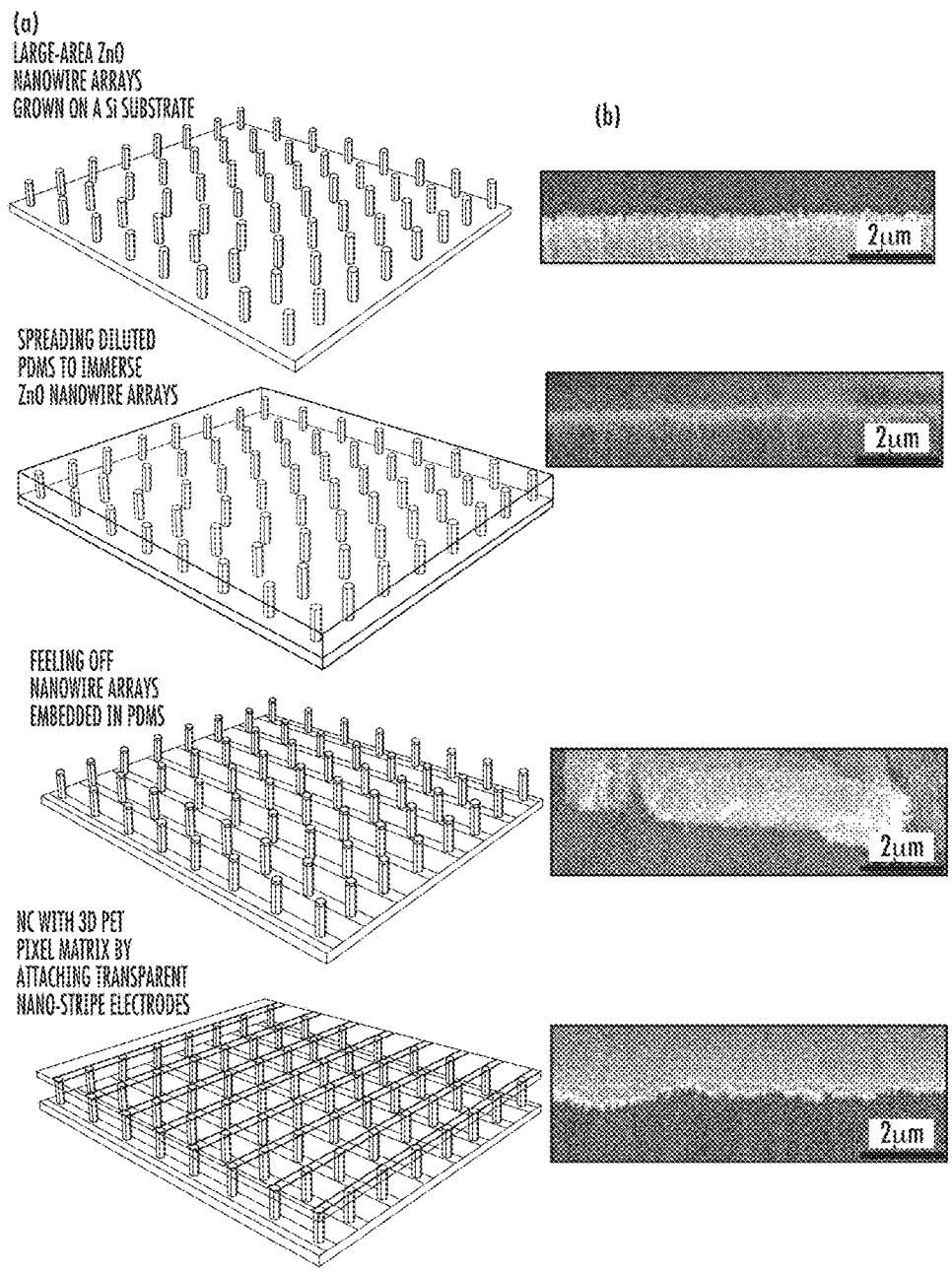
FIG. 6 illustrates one embodiment of a method of forming a nanowire array.

FIG. 6 illustrates one embodiment of a method of forming a nanowire array. Such an array may be used, for example, in an embodiment of a nanowire camera (NC). Column (a) of FIG. 6 is schematic illustrations of processing steps for fabricating an embodiment of a nanowire array with vertically aligned nanowires as 3D PET pixels, and column (b) shows corresponding SEM images of the fabricating process illustrated in column (a). Uniform, vertically aligned nanowire arrays can be grown on a substrate. For example, large area vertically aligned ZnO nanowire arrays can be grown by low-temperature method on flat silicon (Si) substrate (001) with sputtered ZnO as seed layer (10 nm). In one aspect, the nanowire arrays may have a height of ~1.5 µm and a radius of ~25 nm. In other aspects, photonic materials to form the photo gate can be fabricated by a lithography process through a top-down process as used in the semiconductor industry. Diluted dielectric material such as, for example, PDMS, can be spun on the sample to form a uniformed thin layer that immerses all nanowire arrays. PDMS is spread and filled into the nanowire arrays as a protection media. Besides nanowire array protection, PDMS also functions as dielectric material to separate nanowires as independent functional PETs from touching each other. After solidification, the PDMS layer with nanowire arrays imbedded can be peeled off. For example, the integrated ZnO nanowire array layer can be peeled off from the Si substrate in large-scale fashion. The array can be milled with oxygen plasma to expose both ends of the nanowires. Nano-stripe electrodes can be orthogonally attached at bottom and top of the nanowire array to form the embodiment of a NC with 3D PET matrix. Each nanowire in the NC works as an independent 3D PET pixel. A benefit of the described method of fabrication is that is allows fabrication to occur on both ends of the nanowires.

Figures 7A, 7B, 7C, 7D, 7E, 7F:
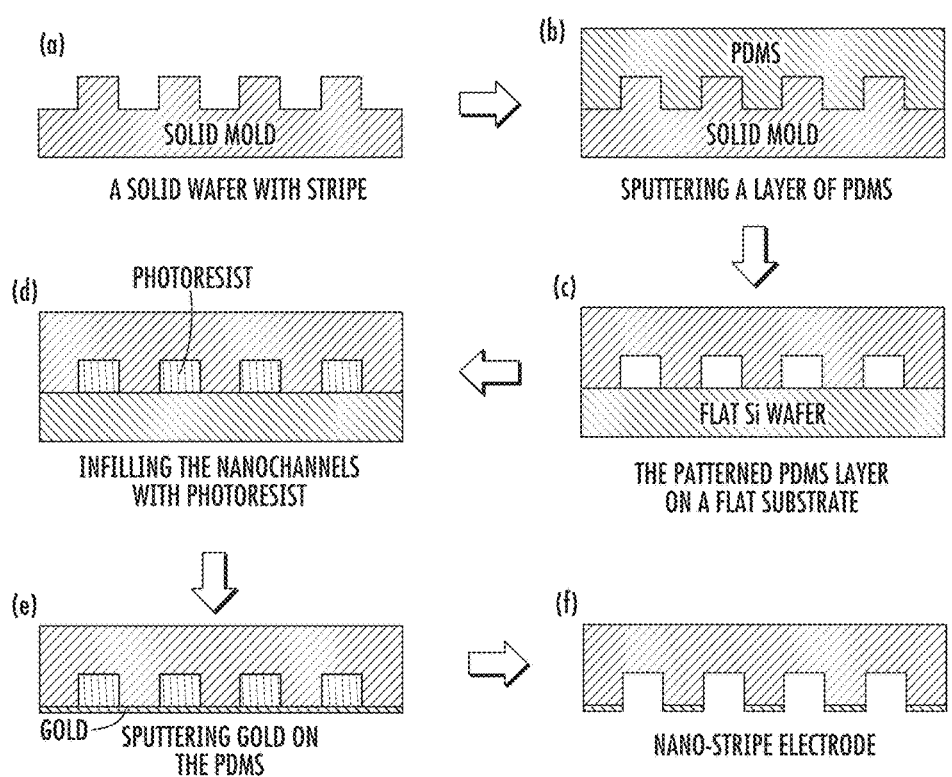
FIGS. 7a-7f illustrate the steps of an exemplary method for making nano-stripe electrodes on a substrate using an imprint method.

FIGS. 7a-7f illustrate the steps of an exemplary method for making nano-stripe electrodes on a substrate (for example, a PDMS substrate) using an imprint method. To effectively make addressable electrical connections to vertically aligned nanowire arrays to form the 3D PET pixels, large area nano-stripe electrodes can be fabricated. In one aspect, these nano-stripe electrodes can be at least partially translucent or transparent. As shown in FIG. 7a, a solid wafer with nano-trench patterns can be prepared as indicated. The stripe width of the electrodes can be controlled to effectively connect on one vertical nanowire at any given radial direction. In FIG. 7b, a layer of diluted PDMS can be sputtered on the solid wafer and then solidified. In FIG. 7c, the PDMS layer can be peeled off with the imprinted nano-stripe patterns and the patterned PDMS layer pressed onto a flat substrate such as, for example a flat Si wafer. In FIG. 7d, the nanochannels can be infilled with photoresist and prebaked. In FIG. 7e, the flat substrate can be peeled off and a thin layer of gold can be sputtered as shown in the figure. After developing to remove photoresist, nano-stripe electrodes form as shown in FIG. 7f.

Figures 8A, 8B, 8C, 8D, 8E, 8F:
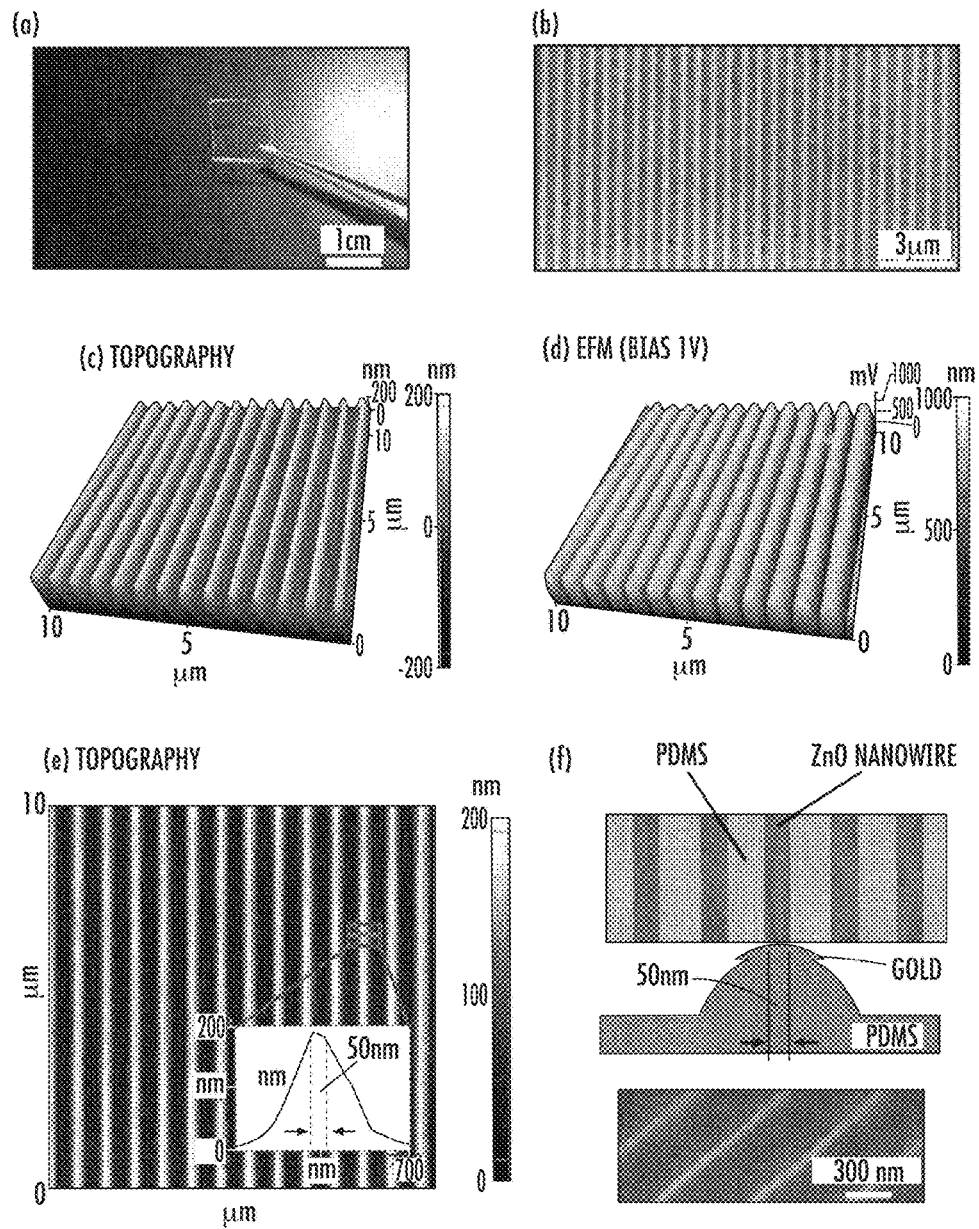
FIGS. 8a-8f illustrate characterization properties of an exemplary PDMS nano-stripe electrode.

FIGS. 8a-8f illustrate characterization properties of an exemplary PDMS nano-stripe electrode. FIG. 8a is a photograph that shows the transparent property of the PDMS nano-stripe electrodes. FIG. 8b is a SEM image of PDMS nano-stripe electrodes. FIG. 8c shows the topography of a PDMS nano-stripe electrode obtained by atomic force microscopy (AFM) scanning in no-contact mode. FIG. 8d is an electrostatic force microscopy (EFM) image of the PDMS nano-stripe electrodes under 1V bias. FIG. 8e is a top view of an EFM image of PDMS nano-stripe electrodes that reveals sharp peaks caused by the electrical field induced conducting stripes. The inset in FIG. 8e shows the scanning profile details and the conducting stripe has a width of ~50 nm. FIG. 8f is a schematic illustration of a nano-stripe electrode connecting with one vertically aligned ZnO nanowire in radial direction to effectively form a PET. The 50 nm wide electrode could connect one single 50 nm diameter ZnO nanowire in the radial direction of the nano-stripe electrode as a nanopixel. The relatively bright lines along the nano-stripe in the SEM image show the effectively conducting nano-stripe electrode has a width of 50 nm.

Figure 9:
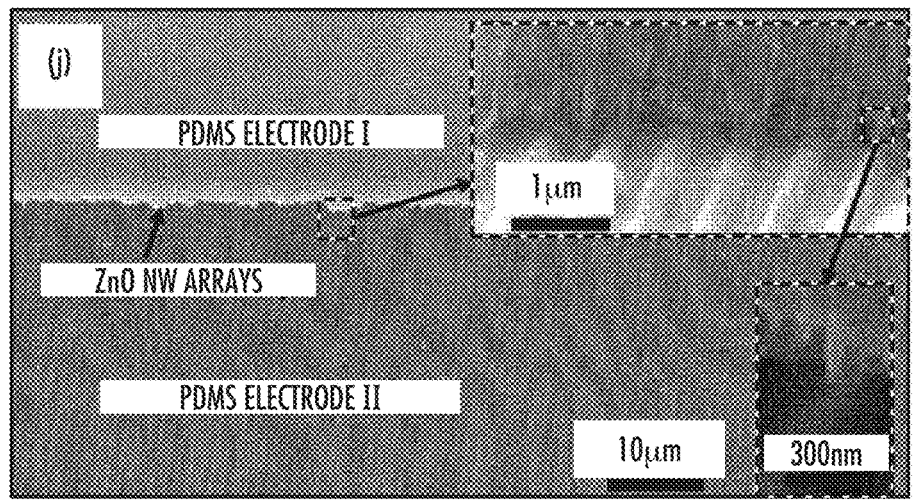
FIG. 9 shows a 45° angle view SEM image of the cross section of NC, indicating the sandwiched structure and the insets are the enlarged images of portions of FIG. 9 to show nanowires connected with stripe electrodes to form effective 3D PETs.

After fabrication of the nanowire array and the nano-stripe electrodes, two nano-stripe electrodes orthogonally sandwich a vertical nanowire array, forming a large-scale 3D PET matrix as the pixels of a NC. FIG. 9 shows a 45° angle view SEM image of the cross section of NC, indicating the sandwiched structure and the insets are the enlarged images of portions of FIG. 9 to show nanowires connected with stripe electrodes to form effective 3D PETs. Such a design enables an individual vertically aligned nanowire as an effective 3D PET as well as the extremely large amount of nanowire integration to form a large sensing area while possessing ultra-high resolution. Because effective planar size of a sensing pixel is determined by the uniformed diameter of nanowire arrays, a NC could be effectively built in wafer size with an extremely high resolution of 50 nm or even higher, which is two orders higher than that of existing highest resolution digital image sensors, such as CMOS and CCD.

Figure 10:
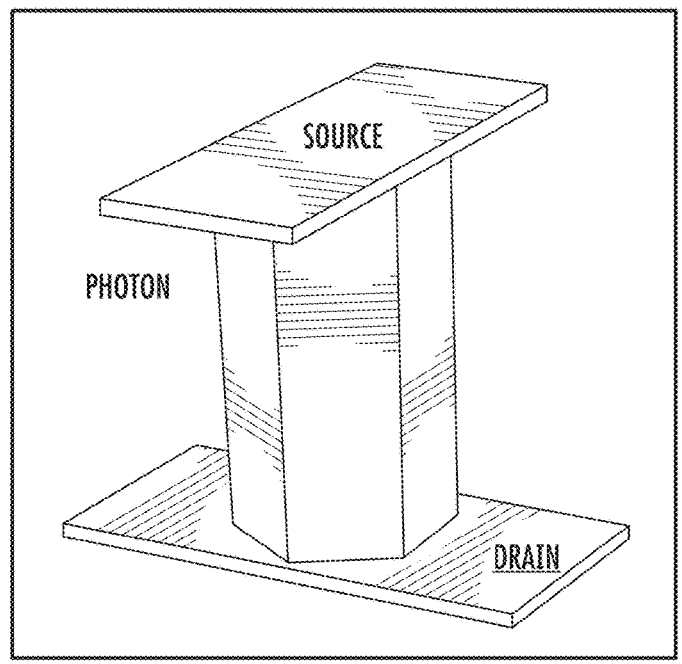
FIG. 10 is a schematic illustration of a vertically-aligned nanowire PET.
Figure 11:
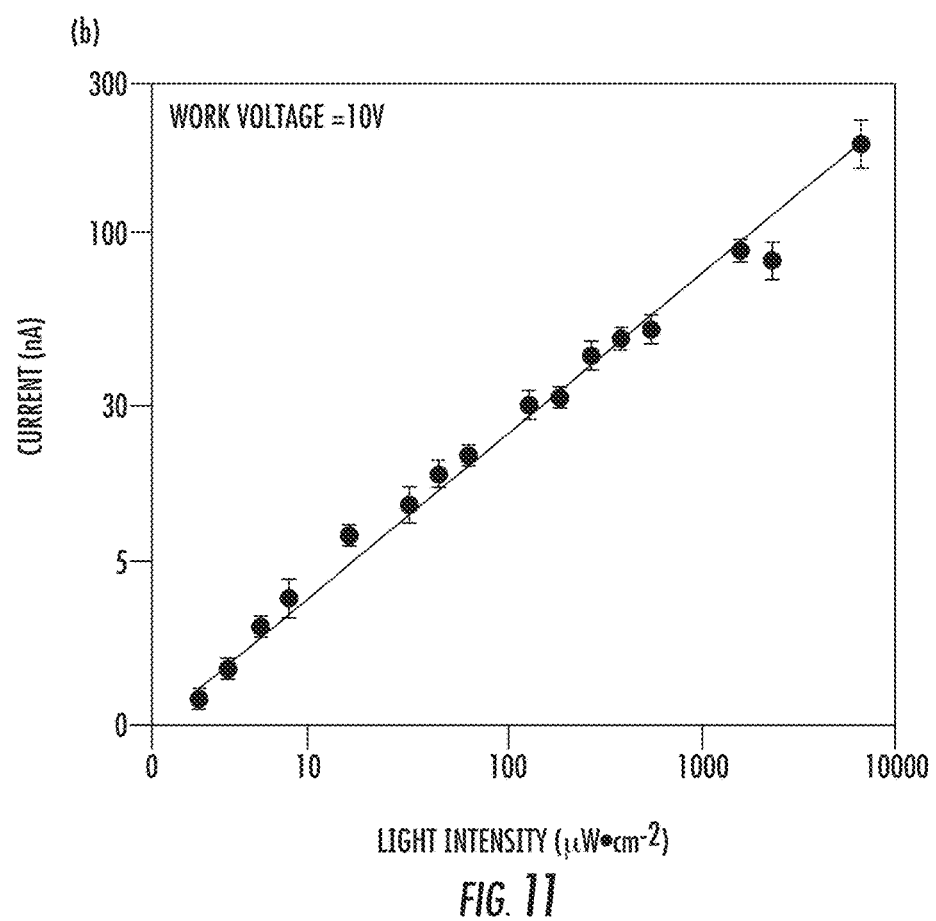
FIG. 11 illustrates an exemplary light intensity-current curve of an embodiment of a PET.
Figure 12:
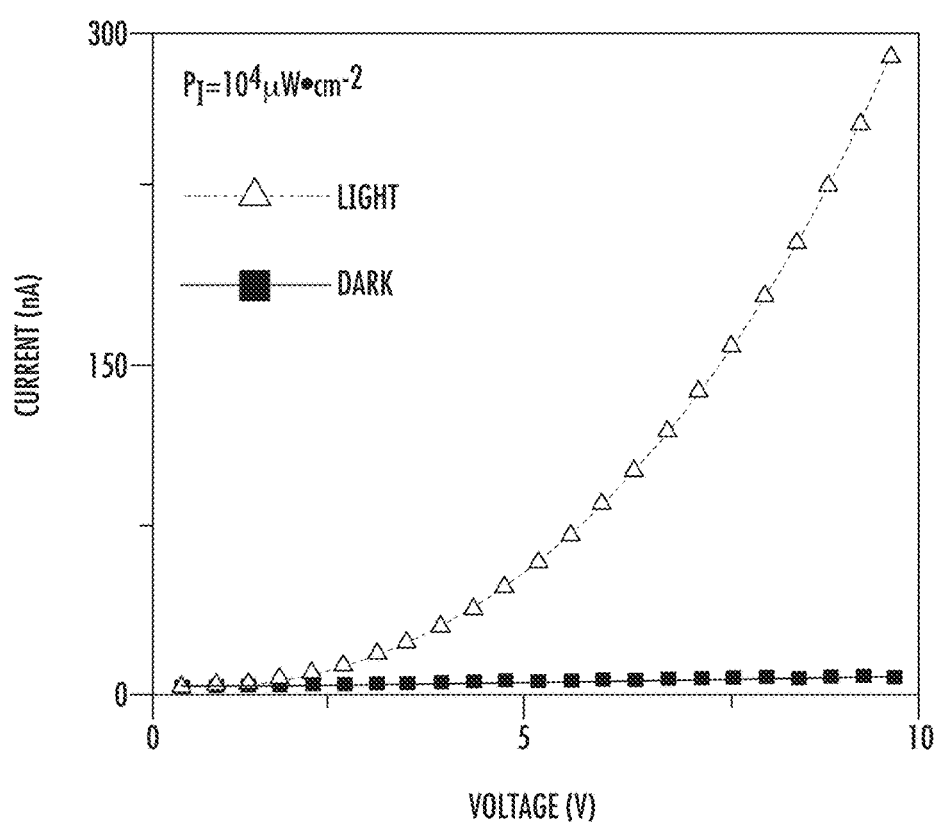
FIG. 12 illustrates the amplifying function of an embodiment of a PET.
Figure 13:
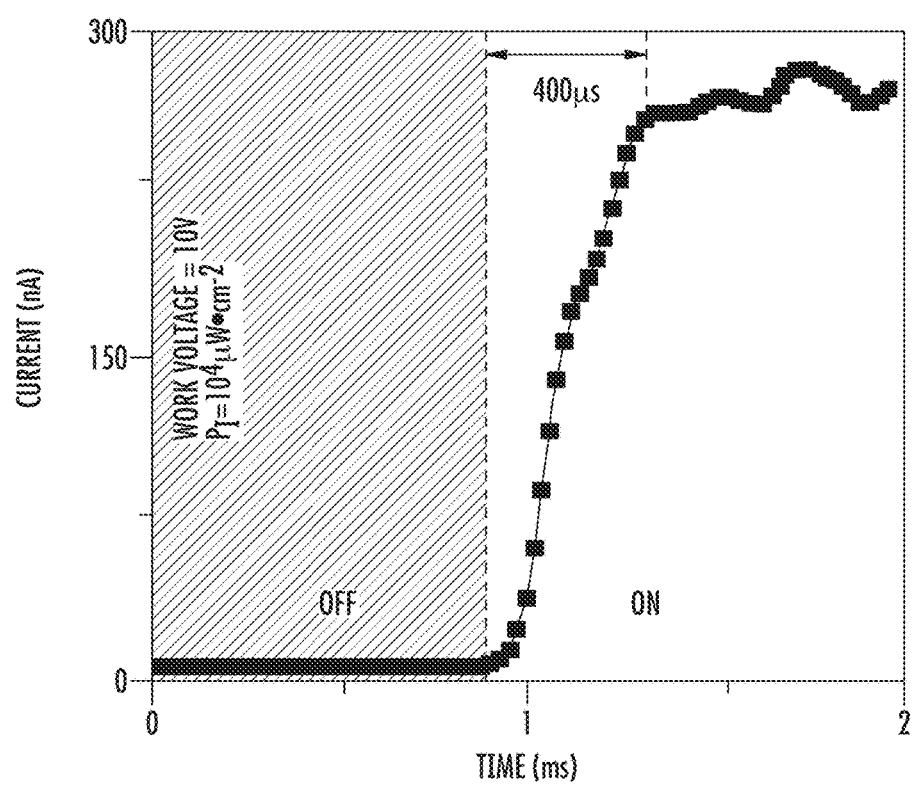
FIG. 13 illustrates the measured current response of a ZnO nanowire PET before and after illumination under 10V bias.

FIG. 10 is a schematic illustration of a vertically-aligned nanowire PET. As shown in FIG. 10, the top and bottom electrodes, which can be at least partially translucent or transparent, function as source and drain. Photons interact with the nanowire, which acts as an electrode-free gate to modulate the nanowire resistance, realizing directly amplified electrical signal output for the input photo intensity. In various aspects, the nanowire can be a ZnO nanowire, Si nanowire, and the like. To evaluate the performance of this embodiment of a 3D vertical PET pixel as indicated in FIG. 10, light is introduced through the top electrode and directly interacts with ZnO nanowire functioning as photon-gate to control the electron density in the nanowire. With a 10V bias between source and drain electrodes, the current measured through the ZnO nanowire is proportional to the intensity of incident light as the measured curve shown in FIG. 11, which well accords with the theoretical calculation result shown in FIG. 3. The intensity-current curve of FIG. 11 demonstrates the comprehensive functions of PET that can directly convert light signals into an amplified electrical current without an intermediate step by using an electrode-free photon-gate. Furthermore, FIG. 11 illustrates that a PET possesses extremely high low-light sensitivity. FIG. 12 shows the amplifying function of PET. The current signal of a ZnO nanowire PET can be magnified by increasing the bias voltage. The lower (straight line) curve and the upper curve represent the voltage-current output of a ZnO nanowire PET under dark and illumination, respectively. Under constant light illumination, current through source and drain can be modulated by bias voltage. Response time is another important characteristic of a photo-sensing pixel and FIG. 13 is the measured current response of a ZnO nanowire PET before and after illumination under 10V bias. The embodiment of a ZnO nanowire PET pixel of the prototype NC has a measured response time of 400 µs, which is higher than CCD and close to that of a CMOS photodiode.

Figure 14:
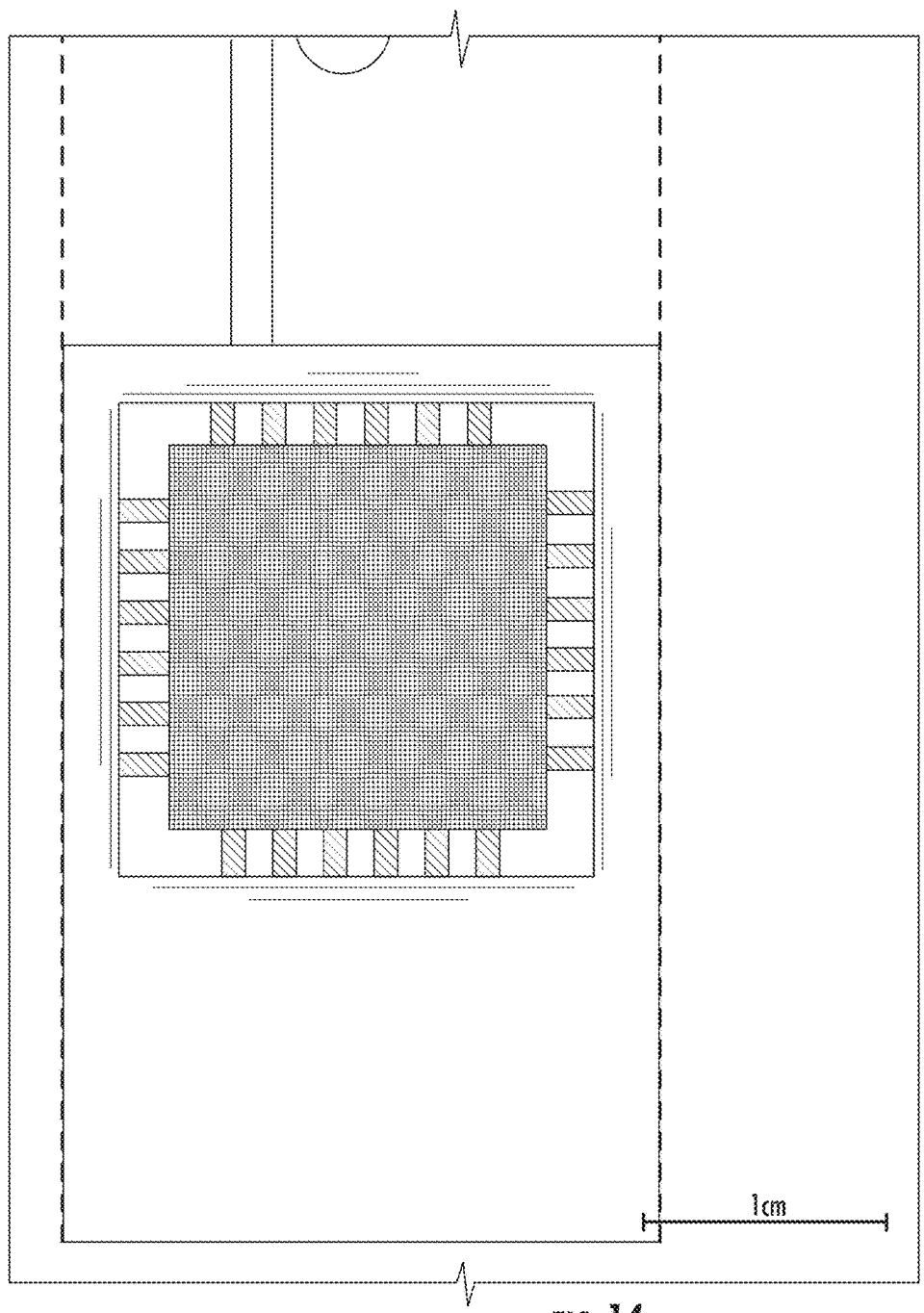
FIG. 14 illustrates an exemplary fabricated nanowire camera packaged in a dual in-line package with image sensor size of ~2 cm×2 cm.
Figure 15:
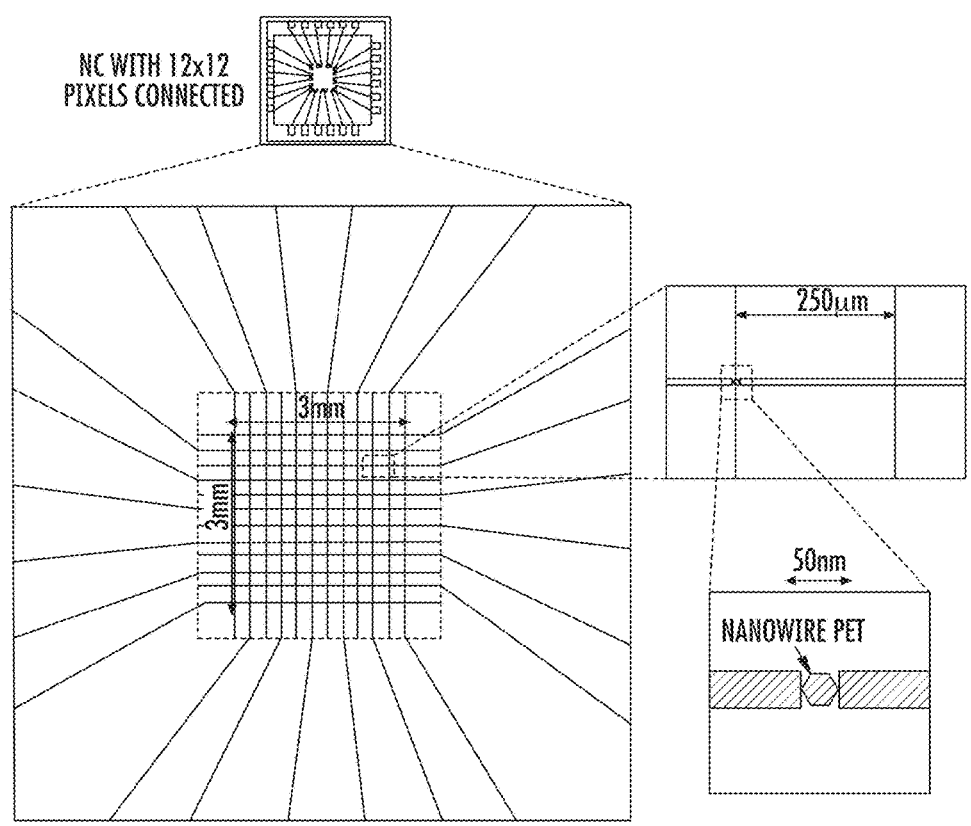
FIG. 15 illustrates a smaller area of the NC of FIG. 14 having 12 by 12 PET pixels connected from top and bottom electrodes, which evenly cover a small area of 3 mm×3 mm in the center of the NC.
Figure 16:
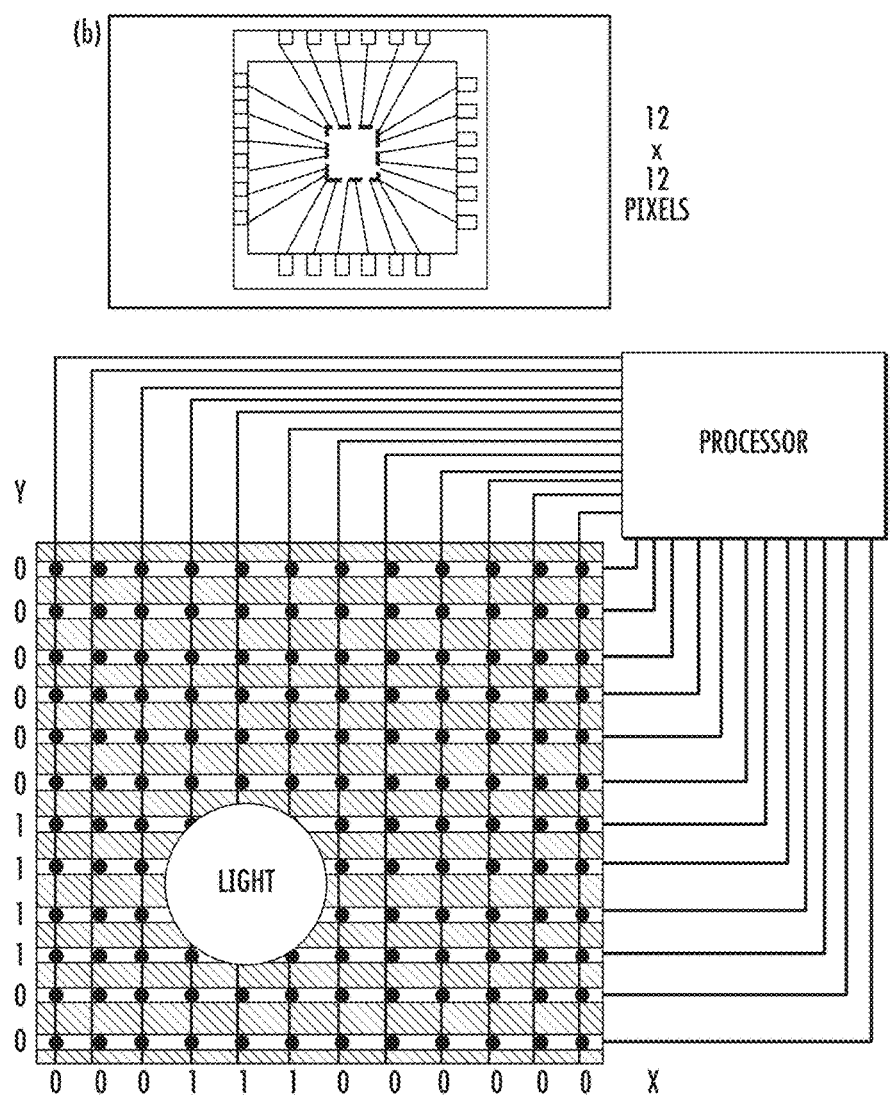
FIG. 16 illustrates an exemplary circuit diagram of the NC with a bias voltage of 10V.

An exemplary fabricated nanowire camera packaged in a dual in-line package with image sensor size of ~2 cm×2 cm is shown in FIG. 14. To demonstrate the nanowire PET pixel can effectively record digital image, 12 by 12 PET pixels are connected from top and bottom electrodes, which evenly cover a small area of 3 mm×3 mm in the center of the NC as indicated in FIG. 15. As shown in FIG. 16, the 12×12 nanowire PET pixel matrix can be connected to a signal readout processor that can locate the current change of each pixel with X-Y addressing technology when a light image is projected onto the NC. FIG. 16 is an exemplary circuit diagram of the NC with a bias voltage of 10V. As shown in FIG. 16, the NC can sense and digitize images with 12×12 50 nm nanowire PET pixels. Brightness of each image pixel is the corresponding current response of light intensity at the small area of 50 nm in diameter, occupied by the individual vertically aligned nanowire PET. The processor can be, for example, a digital image processor or any other device used as a signal processing and control unit for digital cameras and camcorders such as, for example, a field-programmable gate array (FPGA) and the like.

Figure 17:
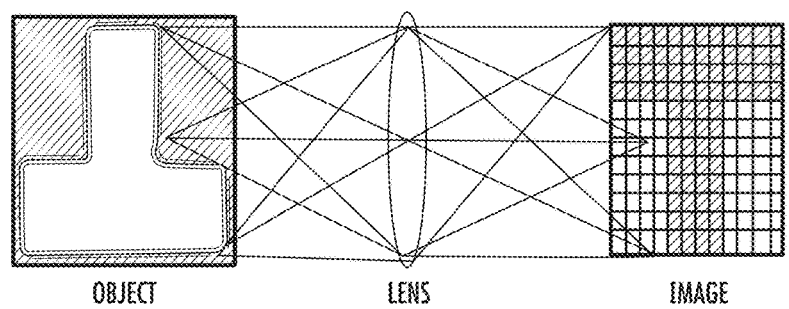
FIG. 17 shows the direct output of an embodiment of a NC when it is exposed to a bright object, e.g. the letter "T"
Figure 18:
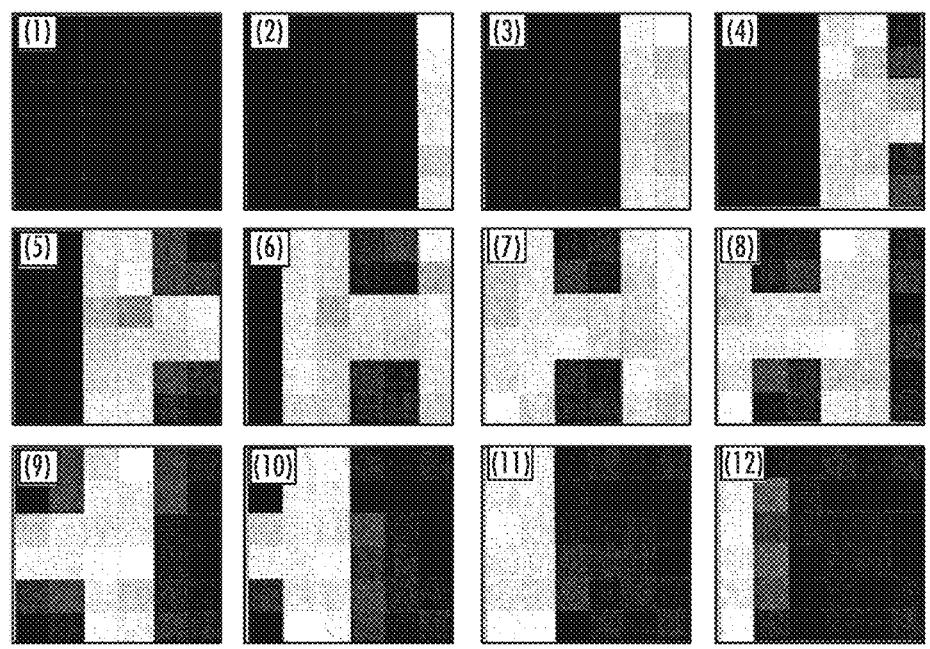
FIG. 18 illustrates a sequence of screen shots (1-12) of image output of a 6×6 pixel NC when it is exposed with the image of moving object "H" from right to left.
Figure 19:
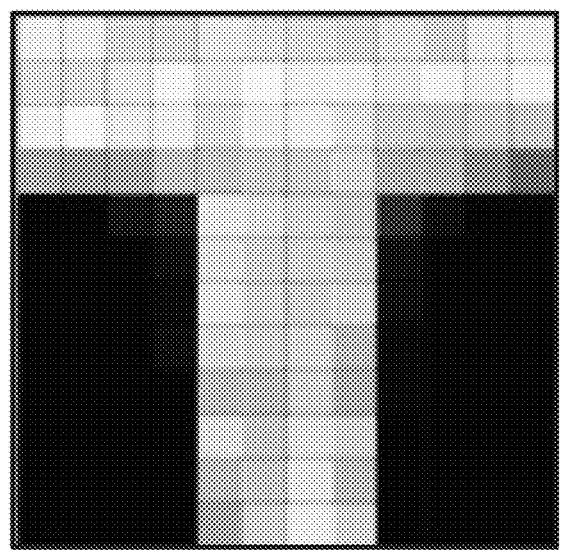
FIG. 19 is an image of object "T" recorded by an embodiment of a NC with 12×12 pixels, each pixel window is an independent PET readout signal channel captured by computerized user interface.
Figure 20:
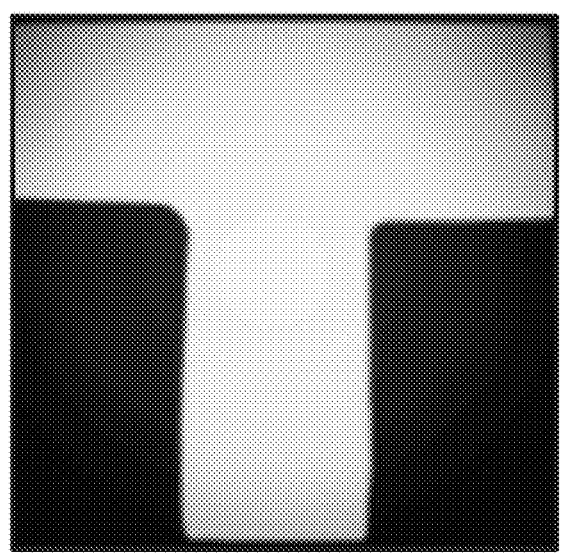
FIG. 20 is a high resolution image of object "T" recorded by scanning an embodiment of a NC with 12×12 pixels from −125 µm to 125 µm in the X and Y directions, with 300 nm increment.
Figure 21:
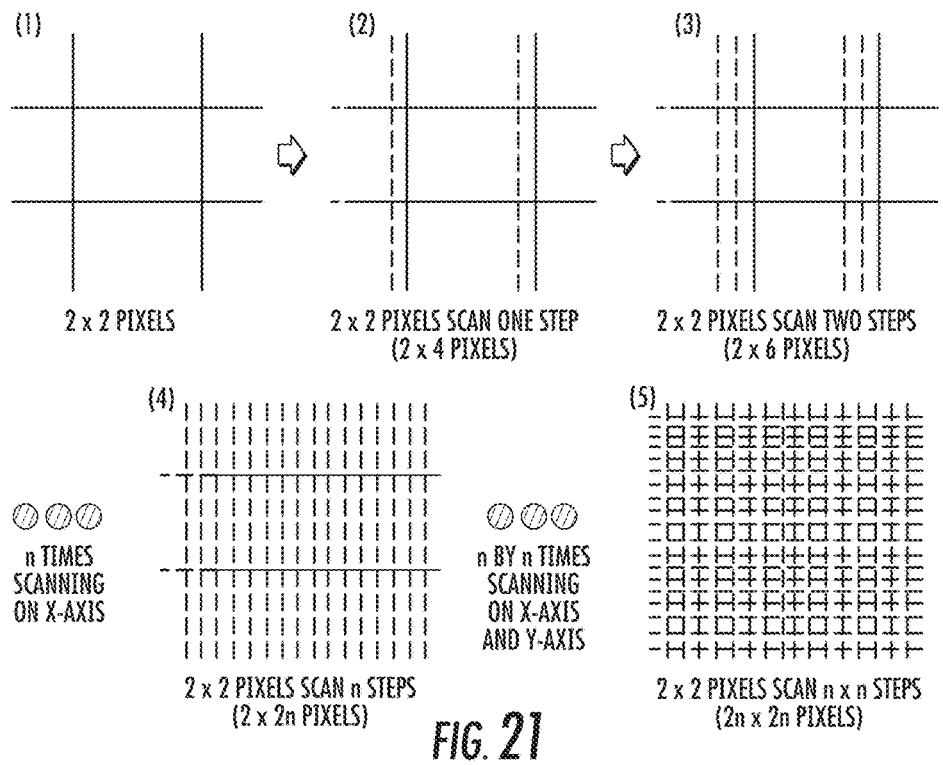
FIG. 21 illustrates a method of scanning using an embodiment of a NC to achieve high resolution images, such as that shown in FIG. 20.

FIG. 17 shows the direct output of the NC when it is exposed to a bright object, e.g. the letter "T". Although the effective image sensing and digitizing function is clearly demonstrated, the extremely high spatial resolution capability of 50 nm is not apparently represented, owing to the relatively low numbers of pixels connected with processor. To vividly demonstrate the actual resolution of NC, the image taking can be implemented by a strategy adapted from stage systems, in which a sequence of images is collected as the camera eccentrically moves in the X and Y directions. For example, FIG. 18 illustrates a sequence of screen shots (1-12) of image output of a 6×6 pixel NC when it is exposed with the image of moving object "H" from right to left. FIG. 19 is an image of object "T" recorded by a NC with 12×12 pixels, each pixel window is an independent PET readout signal channel captured by computerized user interface, and FIG. 20 is a high resolution image of object "T" recorded by scanning a NC with 12×12 pixels from −125 µm to 125 µm in the X and Y directions, with 300 nm increment. FIG. 21 illustrates a method of scanning to achieve high resolution images, such as that shown in FIG. 20. A defined number of pixels (e.g., 2×2) are used to scan at multiple steps (n) in both the X and Y directions. For example, an exemplary NC with only 2×2 pixels can obtain 2n×2n pixels high resolution images by scanning NC at image plane using the method shown.

Figure 22:
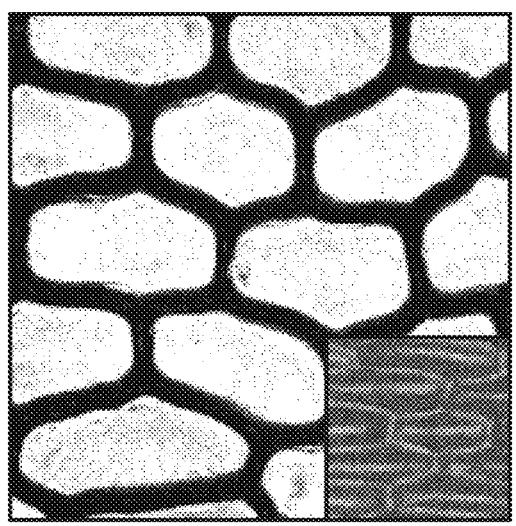
FIG. 22 is an extremely high resolution image of onion epithelium cell recorded by an embodiment of a NC under optical microscope, and was obtained by scanning NC approach (−25 µm to 25 µm in both X and Y, 300 nm increments), the inset image of FIG. 22 is the same image recorded by the microscope CCD camera as comparison, which clearly shows the ultra-high resolution of NC.

FIG. 22 is an extremely high resolution image of onion epithelium cell recorded by a NC under optical microscope, and was obtained by scanning NC approach (−25 μm to 25 μm in both X and Y, 300 nm increments). The inset image of FIG. 22 is the same image recorded by the microscope CCD camera as comparison, which clearly shows the ultra-high resolution of a NC.

Figure 23:
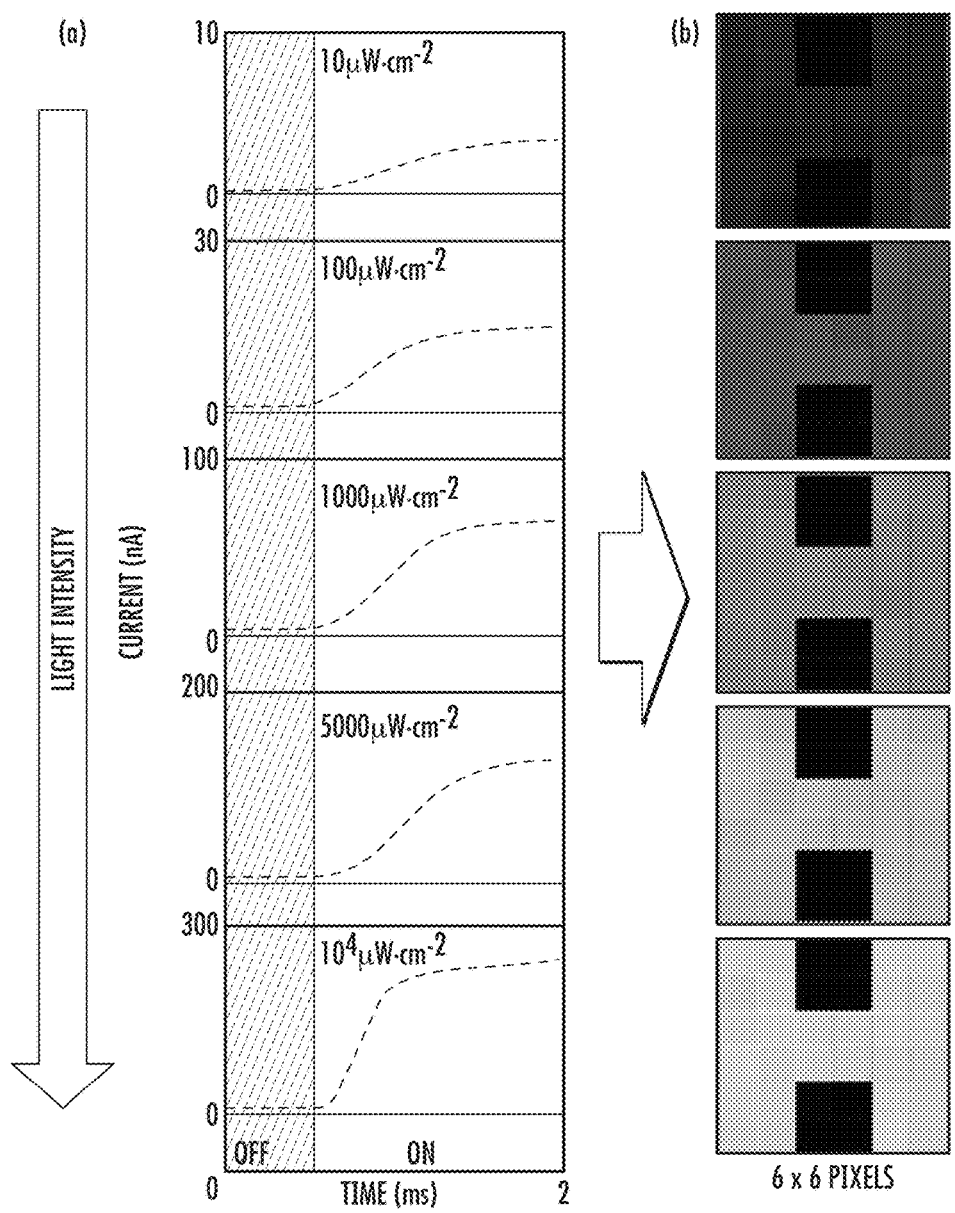
FIG. 23 illustrates an embodiment of a NC's dynamic light intensity response.

A NC's dynamic light intensity response is shown in FIG. 23. With fixed 10V bias and varying illumination light intensity from 10 (top) to 10 (bottom) μW·cm$^{-2}$, the current outputs from one PET pixel are shown in column (a) of FIG. 23. The images output from a NC with 6×6 PET pixel matrix for object "H" illuminated with corresponding light intensity are shown in column (b) of FIG. 23. Objects with varied light illuminating intensity can be successfully recorded and resolved by the grayscales of the images output from NC.

Figure 24:
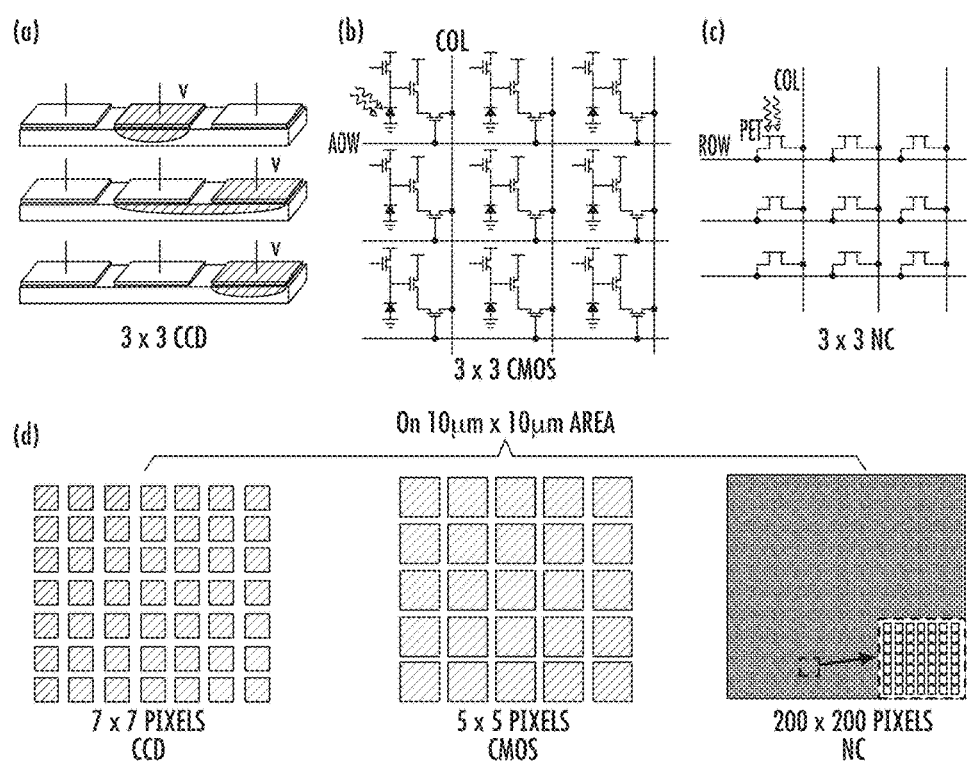
FIG. 24 illustrates a comparison of three types of image sensor technology: charge-coupled device (CCD); complementary metal oxide semiconductor (CMOS); and a nano-camera (NC) using PET technology as described herein, each having 3×3 pixels.

FIG. 24 illustrates a comparison of three types of image sensor technology: charge-coupled device (CCD); complementary metal oxide semiconductor (CMOS); and a nano-camera (NC) using PET technology as described herein, each having 3×3 pixels. In a CCD image sensor, pixels are represented by p-doped capacitors. These capacitors are biased above the threshold for inversion when image acquisition begins, allowing the conversion of incoming photons into electron charges at the semiconductor-oxide interface; then these charges are read out and amplified to obtain photo signal information. Planar size of the capacitor needs to be large enough to produce detectable charges. A CMOS imaging chip is a type of active pixel sensor of complementary metal-oxide-semiconductor. In each pixel, a photo sensor converts the light intensity into a voltage. Additional FET within the same pixel and corresponding circuitry amplify the voltage to digital data. In one CMOS pixel, the amplifier not only has one FET, it needs at least three FETs to magnify the voltage. A NC uses only one two-terminal PET unit as embodiments of such are described herein working as its pixel. The light is converted and amplified into the electrical signal directly, which avoids multi-component, complex interconnect layouts, and dual signal converting and amplification processes. As shown in part (d) of FIG. 24, schematically, with the same sensor size (10 μm×10 μm), the effective pixel number of a NC is significantly larger than that of CCD and CMOS. Table I, below, further describes the features and performance of CCD, CMOS and NC technologies:

TABLE I

| Feature | CCD | CMOS | NC |
| --- | --- | --- | --- |
| Signal output | Electron packet | Voltage | Current |
| Structure complexity | High | High | Extra Low |
| Production cost | High | Moderate | Low |
| Speed | Slow (ms) (ref M20) | Moderate (μs) (ref. M21) | Moderate (μs) |
| Low light sensitivity | Moderate (ref. 5) | Low (ref. 5) | High |
| Pixel size | Medium (1.43 μm) (ref M18) | Big (2.2 μm) (ref M19) | Extra small (50 nm) |
| Power consumption per pixel | High (ref 6) | Low (ref. 6) | Low |

In summary, embodiments of a two-terminal photon-effect transistor (PET), which can replace the three-terminal FET as the primary element that can construct digital integrated circuit, has been described. Photons directly excite electrons to modulate the semiconducting material resistivity between source and drain, realizing an electrode-free gate. The scheme of PET directly converts photo signals into an amplified electrical signal without signal-convention-amplification dual processes, which has significant advantages not only in signal sensing sensitivity and fidelity but also in sensing unit miniaturization and device fabricating simplification. Based on PET, a nanowire camera (NC) can be fabricated by sandwiching vertically aligned nanowire arrays in between of top and bottom orthogonal nano-stripe electrodes. A vertically aligned nanowire can function as an independent nanoscale 3D PET pixel and can effectively and directly sense image through the electrode-free photon gate modulated current amplification process. A large area NC, integrating millions of vertically aligned nanowire arrays as 3D PET pixels, has a planar pixel size of approximately 50 nm, which is nearly two orders higher than that of existing image sensors. A full frame image sensor can easily have 336 billion pixels, if the PET architecture is adopted. Interpreting the vision world by a NC, which has an order higher resolution (50 nm) than the wavelength of visible light (400 nm-700 nm), would have profound impact on human understanding and cognition. Besides the intense impact on electronic sensors, PET could also bring about advances in the photon computer by directly converting photo signals into amplified electrical signal, which not only reduces signal distortion by totally eliminate the electrical-photo-electrical conversion steps but also substantially reduce the complexity of the component structure and circuit layout. Other uses of PET can include, but not be limited to, image sensing, photonic computer, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A photon-effect transistor comprising:
   a source;
   a drain; and
   a photosensitive semiconducting material comprised of a single layer located between the source and the drain, wherein the photosensitive semiconducting material is configured to be junction-free and to interact with photo signals to form an electrode-free photon gate so as to provide a direct electrical amplification of the photo signals.

2. The photon-effect transistor of claim 1, wherein the source, the photon-gate and the drain are integrated onto a single chip.

3. The photon-effect transistor of claim 1, wherein current flow between the source and the drain is controlled by a light signal received by the photon-gate.

4. The photon-effect transistor of claim 1, wherein the photon-gate is at least partially comprised of photonic materials.

5. The photon-effect transistor of claim 4, wherein the photonic material is at least partially comprised of zinc oxide (ZnO).

6. The photon-effect transistor of claim 4, wherein the photonic material is at least partially comprised of silicon (Si).

7. The photon-effect transistor of claim 1, wherein one or both of the source and the drain are at least partially comprised of material that allow light to pass through them.

8. The photon-effect transistor of claim 1, wherein the source is located at one plane end of the photosensitive semiconducting material and the drain is located at another plane end of the photosensitive semiconducting material.

9. The photon-effect transistor of claim 1, wherein the photosensitive semiconducting material is made of n-type semiconductor.

10. The photon-effect transistor of claim 1, wherein the source, the drain and the photosensitive semiconducting material are configured to work as an entire image sensor pixel.

11. The photon-effect transistor of claim 1, wherein the electrode-free photon gate is configured to provide a direct electrical amplification of the photo signals under a constant bias voltage applied across the source and drain.

12. A photon-effect transistor comprising:
    a source;
    a junction-free photosensitive semiconducting material; and
    a drain, wherein the junction-free photosensitive semiconducting material is between and in direct contact with the source and the drain, and is configured to sense photo signals and form an electrode-free photon gate so as to electrically amplify the photo signals.

13. The photon-effect transistor of claim 12, wherein the photon-gate is an electrode-free photon-gate.

14. The photon-effect transistor of claim 12, wherein the PET comprises a photosensitive semiconducting material that is configured as a single layer and is configured to interact with the photo signals to form the said photo-gate.

15. The photon-effect transistor of claim 14, wherein the photosensitive semiconducting material are made of n-type semiconductor.

16. The photon-effect transistor of claim 12, wherein the source, the drain and the photon-gate are configured to work as an entire image sensor pixel.

17. The photon-effect transistor of claim 12, wherein the electrode-free photon gate is configured to electrically amplify the photo signals under a constant bias voltage applied across the source and drain.

18. A photon-effect transistor comprising:
    a source;
    a drain; and
    a single layer of photosensitive semiconducting material located between the source and the drain, wherein the single layer of photosensitive semiconducting material is configured to be junction-free and to interact with photo signals to form an electrode-free photon gate so as to provide a direct electrical amplification of the photo signals; wherein the source, the drain and the single layer of photosensitive semiconducting material is configured to work as an entire image sensor pixel.

19. The photon-effect transistor of claim 18, wherein the single layer of photosensitive semiconducting material is made of n-type semiconductor.

20. The photon-effect transistor of claim 18, wherein the electrode-free photon gate is configured to provide a direct electrical amplification of the photo signals under a constant bias voltage applied across the source and drain.

\* \* \* \* \*